(12) United States Patent
Schultz et al.

(10) Patent No.: US 7,053,787 B2
(45) Date of Patent: May 30, 2006

(54) SLICKLINE SIGNAL FILTERING APPARATUS AND METHODS

(75) Inventors: Roger L. Schultz, Aubrey, TX (US); Dingding Chen, Plano, TX (US); Orlando DeJesús, Stillwater, OK (US)

(73) Assignee: Halliburton Energy Services, Inc., Houston, TX (US)

( * ) Notice: Subject to any disclaimer, the term of this patent is extended or adjusted under 35 U.S.C. 154(b) by 673 days.

(21) Appl. No.: 10/187,529

(22) Filed: Jul. 2, 2002

(65) Prior Publication Data
US 2004/0003921 A1 Jan. 8, 2004

(51) Int. Cl.
*H03H 7/30* (2006.01)

(52) U.S. Cl. .............................. 340/854.1; 379/406.08; 708/322

(58) Field of Classification Search ............. 340/854.4, 340/853.1; 367/83, 44; 166/64; 73/152.54; 702/104; 708/322; 379/406.08; 375/232; 333/18
See application file for complete search history.

(56) References Cited

U.S. PATENT DOCUMENTS

| | | | |
|---|---|---|---|
| 4,730,281 A | 3/1988 | Rodney et al. | |
| 5,233,866 A | 8/1993 | Desbrandes | |
| 5,272,680 A | 12/1993 | Stone et al. | |
| 5,351,531 A | 10/1994 | Kerr | |
| 5,554,273 A | 9/1996 | Demmin et al. | |
| 5,617,337 A | 4/1997 | Eidler et al. | |
| 5,642,301 A | 6/1997 | Warrior et al. | |
| 5,803,186 A | 9/1998 | Berger et al. | |
| 5,828,981 A | 10/1998 | Callender et al. | |
| 5,862,513 A | 1/1999 | Mezzatesta et al. | |
| 5,995,910 A | 11/1999 | Discenzo | |
| 6,002,985 A | 12/1999 | Stephenson | |
| 6,128,585 A | 10/2000 | Greer | |
| 6,151,961 A | 11/2000 | Huber et al. | |
| 6,236,908 B1 | 5/2001 | Cheng et al. | |
| 6,282,452 B1 | 8/2001 | DeGuzman et al. | |
| 6,536,519 B1* | 3/2003 | Vaynshteyn et al. | 166/64 |
| 6,760,275 B1* | 7/2004 | Carstensen | 367/83 |
| 6,781,520 B1* | 8/2004 | Smith et al. | 340/853.1 |
| 6,781,521 B1* | 8/2004 | Gardner et al. | 340/854.4 |

FOREIGN PATENT DOCUMENTS

| | | |
|---|---|---|
| WO | 98/03852 A1 | 1/1998 |
| WO | WO 96/42058 A1 | 12/1998 |
| WO | WO 98/55836 A1 | 12/1998 |

OTHER PUBLICATIONS

U.S. Appl. No. 09/298,691, Filed Apr. 23, 1999.
SPE 26063, "New Electronic Measurement System Enhances Slickline Service Capabilities," dated 1993.
Halliburton Slickline Collar Location Manual No. 146SLC20, dated Feb. 21, 2001.

* cited by examiner

*Primary Examiner*—Albert K. Wong
(74) *Attorney, Agent, or Firm*—Marlin R. Smith

(57) ABSTRACT

A signal filtering apparatus and associated methods enable noise to be significantly reduced or eliminated from a signal. In a described embodiment, the signal is indicative of tension in a slickline. An adaptive filter is used to effectively cancel the noise from the signal, using an input signal characteristic of a noise source.

40 Claims, 10 Drawing Sheets

SLICKLINE SIGNAL FILTERING APPARATUS AND METHODS

BACKGROUND

The present invention relates generally to operations performed and equipment utilized in conjunction with subterranean wells and, in an embodiment described herein, more particularly provides a slickline signal filtering apparatus and associated methods.

A slickline rig is commonly used to perform operations in a subterranean well. One advantage of using slickline rigs is that they are relatively inexpensive to maintain and operate. Another advantage is that, due to the relatively small size of a slickline rig, it may be readily and conveniently transported and installed at a wellsite.

One function typically performed by a slickline rig is that of depth correlation. A tool known as a casing collar locator is conveyed through a casing string in a well suspended from a metal line (the slickline) spooled on the slickline rig. The casing collar locator generates a magnetic field and, as the collar locator passes through a casing collar, the increased metal mass causes a corresponding increase in a magnetic force (due to the magnetic field) biasing the collar locator into contact with the casing string.

This increased magnetic force in turn causes an increase in tension in the slickline attached to the collar locator. The increased tension is sensed at the surface by a load cell or other force sensor on the slickline rig. In this manner, an operator at the surface can detect when the collar locator passes through a casing collar and, since the depth of each casing collar is known, the depth of the collar locator (and any other tools conveyed on the slickline) may be determined.

Unfortunately, the signal obtained from the force sensor on the slickline rig is typically contaminated with noise, which sometimes makes it difficult to accurately discern the increased tension due to the collar locator passing through a casing collar. The noise may be a result of any number of contributing factors, for example, due to the environment about the slickline rig, due to characteristics of the rig itself, etc. This makes it very difficult to isolate the slickline from vibrations, etc. which alter the tension measured in the slickline by the force sensor.

It will, thus, be readily appreciated that it would be highly desirable to reduce or eliminate the noise present in the contaminated signal output by the force sensor. This would permit more accurate casing collar detection in the signal, which would enable more accurate depth correlation. Furthermore, the reduction or elimination of noise in the force sensor signal would permit the signal to be used for data transmission, for example, to transmit pressure and temperature measurements via slickline tension modulation.

SUMMARY

In carrying out the principles of the present invention, in accordance with an embodiment thereof, a slickline signal noise filtering apparatus is provided which solves the above problems in the art. The apparatus does not require isolation of the slickline from the noise-producing factors, and maintains the economic and convenience advantages of slickline use. Associated methods are also provided, including methods whereby data transmission is performed via slickline tension modulation.

In one aspect of the invention, a method of filtering a noise-contaminated slickline signal is provided. The method includes the steps of detecting tension in a slickline using a force sensor, an output signal of the force sensor being contaminated by noise due to a noise source inducing tension in the slickline; generating a noise-indicative signal which is indicative of the noise source; inputting the noise-indicative signal to an adaptive filter; summing an output signal of the adaptive filter with the noise-contaminated force sensor output signal to thereby produce a sum; inputting the sum to the adaptive filter; and adapting the filter in response to the noise-indicative signal inputting and sum inputting steps.

In another aspect of the invention a method of transmitting data in a well is provided. The method includes the steps of receiving the data in a slickline tool positioned in the well; displacing the slickline tool in the well attached to a slickline; and modulating tension in the slickline using the slickline tool, to thereby transmit individual bits of the data represented by varying tension levels in the slickline.

In yet another aspect of the invention, a signal filtering apparatus is provided. The apparatus includes an adaptive filter and a summer. The adaptive filter receives a signal indicative of a noise source, and produces a filtered output signal. The summer receives a noise-contaminated signal and the filtered output signal. A sum produced by the summer is input to the adaptive filter. The adaptive filter adapts in response to the sum and the noise-indicative signal input to the filter.

In a further aspect of the invention, a method of reducing noise in a noise-contaminated signal is provided. The method includes the steps of obtaining a noise-indicative signal which is indicative of a source of the noise; inputting the noise-indicative signal to an adaptive filter; summing an output signal of the adaptive filter with the noise-contaminated signal; inputting a sum resulting from the summing step to the adaptive filter; and adapting the adaptive filter in response to the noise-indicative signal inputting and sum inputting steps.

These and other features, advantages, benefits and objects of the present invention will become apparent to one of ordinary skill in the art upon careful consideration of the detailed description of a representative embodiment of the invention hereinbelow and the accompanying drawings.

DETAILED DESCRIPTION

Figure 1:
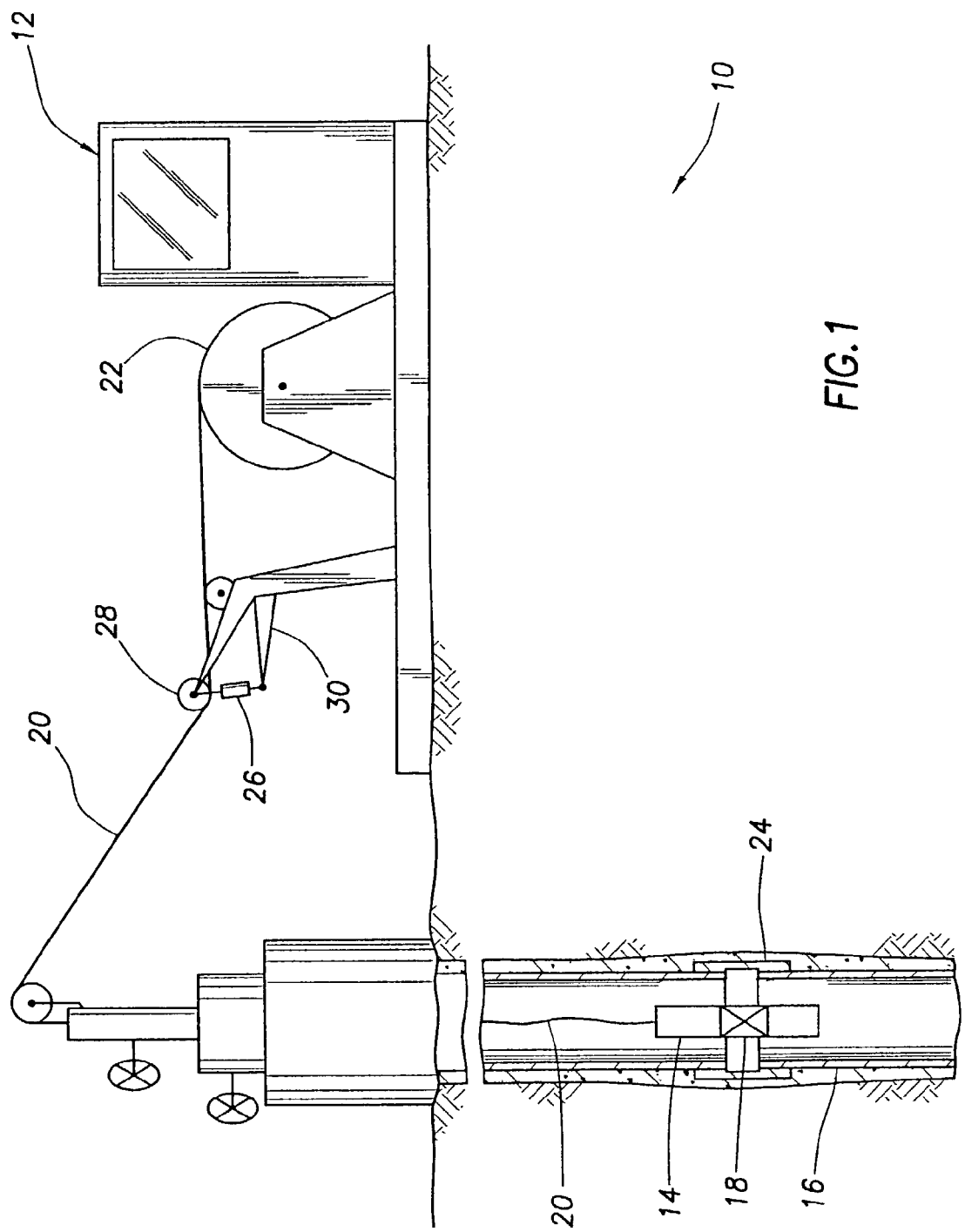
FIG. 1 is a schematic, partially cross-sectional, view of a method embodying principles of the present invention.

Representatively illustrated in FIG. 1 is a method 10 which embodies principles of the present invention. In the following description of the method 10 and other apparatus and methods described herein, directional terms, such as "above", "below", "upper", "lower", etc., are used only for convenience in referring to the accompanying drawings. Additionally, it is to be understood that the various embodiments of the present invention described herein may be utilized in various orientations, such as inclined, inverted, horizontal, vertical, etc., and in various configurations, without departing from the principles of the present invention.

In the method 10, a slickline rig 12 is used to convey a casing collar locator or other slickline tool 14 through a casing string 16 in a well. The collar locator 14 includes a magnet 18 which generates a magnetic field, thereby biasing the collar locator into contact with the casing string 16. The collar locator 14 is conveyed upwardly through the casing string 16 by a slickline 20. The slickline 20 is attached to the collar locator 14 and is spooled on a reel 22 of the rig 12.

As the slickline 20 pulls the collar locator 14 upwardly through the casing string 16, the magnetically-biased contact between the collar locator and the casing results in friction therebetween, which induces tension in the slickline. As the collar locator 14 passes through a casing collar 24, the magnetic attraction between the magnet 18 and the casing string 16 increases, causing an increased tension in the slickline 20. By detecting this increased tension in the slickline 20, the presence of the casing collar 24 may be detected, and the depth of the collar locator 14 may be determined.

Tension in the slickline 20 is sensed using a load cell or other force sensor 26 on the slickline rig 12. The sensor 26 depicted in FIG. 1 is attached between a sheave 28 and an arm 30 of the rig 12. Other types of slickline tension measuring devices may be used, without departing from the principles of the invention.

It will be readily appreciated that there are many ways in which tension in the slickline 20 can be varied, other than due to magnetically-biased contact between the collar locator 14 and the casing string 16. For example, if the rig 12 is installed on an offshore platform, vibration of the platform due to pumps, drawworks, etc. thereon will vary tension in the slickline 20. As another example, vibration of the reel 22 due to its operating mechanism will vary tension in the slickline 20. These and other variations in the slickline tension due to extraneous sources are detected by the sensor 26, which consequently outputs a noise-contaminated signal. This noise-contaminated signal is a combination of a desirable information-carrying signal indicative of slickline tension due to the conveyance of the collar locator 14 through the casing string 16, as well as an undesirable "noise" signal indicative of slickline tension variation due to various noise sources.

Figure 2:
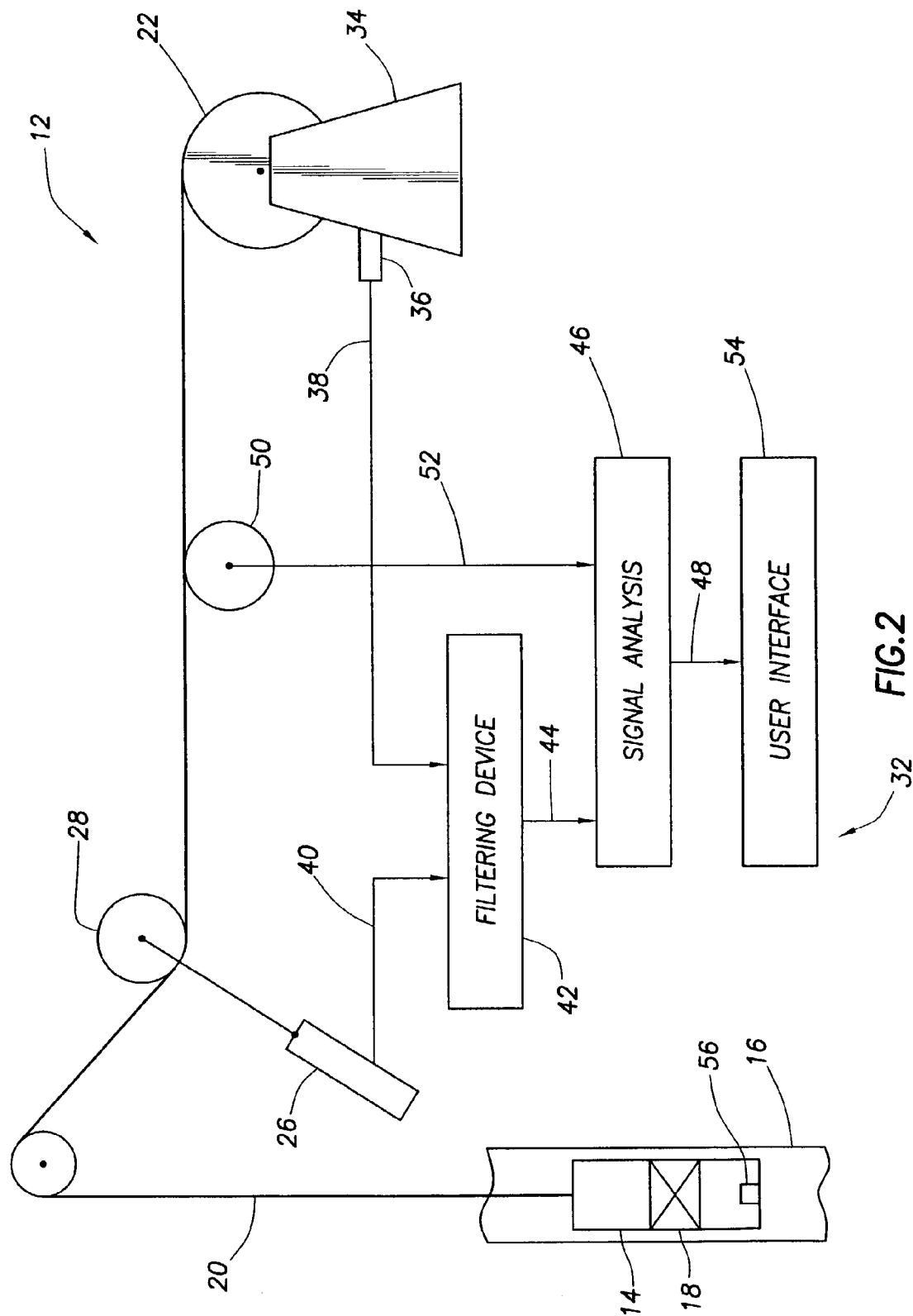
FIG. 2 is schematic view of a signal filtering apparatus used in the method of FIG. 1, the apparatus embodying principles of the invention.

Referring additionally now to FIG. 2, a slickline signal filtering apparatus 32 is schematically illustrated. The signal filtering apparatus 32 is used in the method 10 to eliminate, or at least significantly reduce, the presence of the undesirable noise signal in the output of the sensor 26.

In the apparatus 32 as depicted in FIG. 2, vibration in a support structure 34 for the reel 22 is taken to be a significant contributor to the noise in the output of the sensor 26. It is to be clearly understood, however, that this is only one example of a noise source, and there may be other sources of noise instead of, or in addition to, vibration of the support structure 34.

An accelerometer 36 is attached to the support structure 34. As the support structure 34 vibrates, the accelerometer 36 generates a signal 38 which is indicative of the vibration. For example, the accelerometer signal 38 may indicate the presence, amplitude and frequency of the support structure 34 vibration. Although only one accelerometer 36 is shown in FIG. 2, any number of accelerometers may be used, for example, three accelerometers oriented along three corresponding orthogonal axes of the support structure 34.

It is important at this point to recognize that the accelerometer signal 38 is not the same as the noise present in the contaminated signal 40 output by the force sensor 26. If this were the case, cancellation of the noise from the sensor signal 40 would be a simple matter of subtracting the accelerometer signal 38 from the sensor signal. Instead, vibration of the support structure 34 is transmitted via a multitude of pathways to the slickline 20 (for example, via the reel 22) and to the force sensor 26 (for example, via the arm 30), so that, although the signal 38 output by the accelerometer 36 is indicative or characteristic of the noise source, it is not the noise signal present in the contaminated signal 40 output by the sensor 26.

In order to reduce or eliminate the noise signal contribution to the contaminated signal 40, both the contaminated signal 40 and the signal 38 output by the accelerometer 36 are input to a filtering device 42 of the apparatus 32. The filtering device 42 uses these inputs to produce an output signal 44 in which the contribution of the noise signal to the contaminated signal 40 is eliminated, or at least significantly reduced.

The output signal 44 is then input to a signal analysis unit 46, in which useful information is extracted from the output signal. As depicted in FIG. 2, the unit 46 is a depth correlation unit which produces an output signal 48 indicative of a depth of the collar locator 14, the presence of casing collars, etc. A measuring wheel 50 in contact with the slickline 20 provides an output signal 52 to the depth correlation unit 46 for use in calculating the depth of the collar locator 14.

The output 48 from the depth correlation unit 46 is preferably transmitted to a user interface 54, whereby an operator may view the results of the depth correlation, make adjustments to various parameters involved in the signal filtering and depth correlation processes, etc.

Note that the depth correlation unit 46 may instead, or in addition, be another type of signal analysis unit. For example, the signal analysis unit 46 may be used to extract information represented by data bits in the signal 44 output from the filtering device 42. These data bits may be present in the signal 40 output from the sensor 26 due to turning the magnet 18 alternately on and off as the tool 14 is conveyed through the casing string 16.

If the magnet 18 is turned on and off alternately as the tool 14 is conveyed through the casing string 16, it will be readily appreciated that tension in the slickline 20 will be correspondingly increased and decreased, respectively. These increases and decreases in tension may be used to represent data bits. For example, by turning on the magnet 18 and producing an increased tension in the slickline 20, a data bit of "1" may be transmitted. By turning off the magnet 18 and producing a decreased tension in the slickline 20, a data bit of "0" may be transmitted.

This method of data transmission by slickline tension modulation may be useful in a wide variety of circumstances. For example, in FIG. 2, a pressure and temperature sensor 56 is carried on the tool 14. As the tool 14 is conveyed through the casing string 16, the magnet 18 is turned alternately on and off to transmit data bits indicative of pressures and temperatures sensed by the sensor 56. Of course, other types of data, such as gamma count, fluid properties, etc. may be transmitted, in keeping with the principles of the invention.

Figure 3:
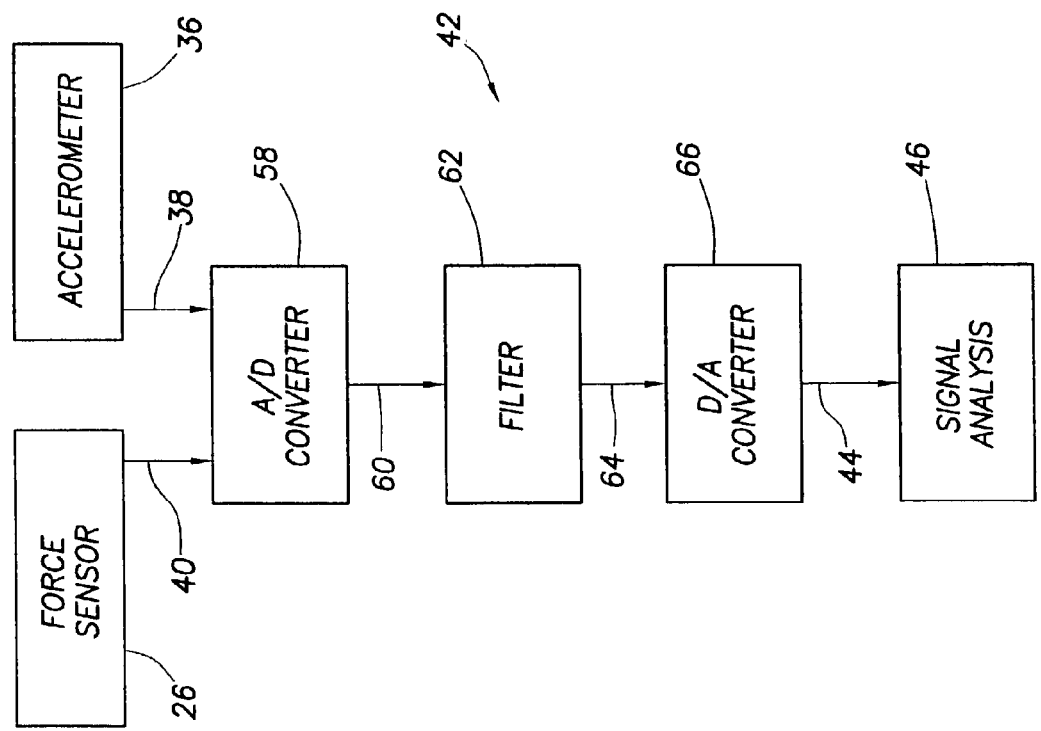
FIG. 3 is a block diagram of a signal filtering device of the apparatus of FIG. 2.

Referring additionally now to FIG. 3, a schematic block diagram of the filtering device 42 is representatively illustrated. As described above, the filtering device 42 receives the signals 40, 38 output by the force sensor 26 and accelerometer 36, respectively, and produces an output signal 44 which is input to the signal analysis unit 46.

Initially, the signals 38, 40 are preferably input to an analog-to-digital converter 58. This step may also include signal conditioning, e.g., placing the signals 38, 40 in a usable form for the remainder of the signal filtering process. An output 60 of the converter 58 is, thus, in digital form and ready for further processing.

The converter output 60 (which includes digitized and conditioned versions of the signals 38, 40) is then input to a filter 62. The filter 62 performs the function of reducing or eliminating the contribution of the noise signal to the contaminated signal 40. An output 64 of the filter 62, thus, is more closely representative of the tension in the slickline 20 due to desired sources (e.g., the tool 14) rather than due to noise sources (e.g., the vibration of the support structure 34).

The filter output 64 may be transmitted directly to the signal analysis unit 46 in digital form, or it may be input to another converter 66 prior to transmission to the signal analysis unit. As depicted in FIG. 3, the converter 66 is a digital-to-analog converter since, in this particular example, the signal analysis unit 46 is configured to receive analog signals. The converter 66 may also include signal conditioning to place the output 44 in a form usable by the signal analysis unit 46.

Figure 4:
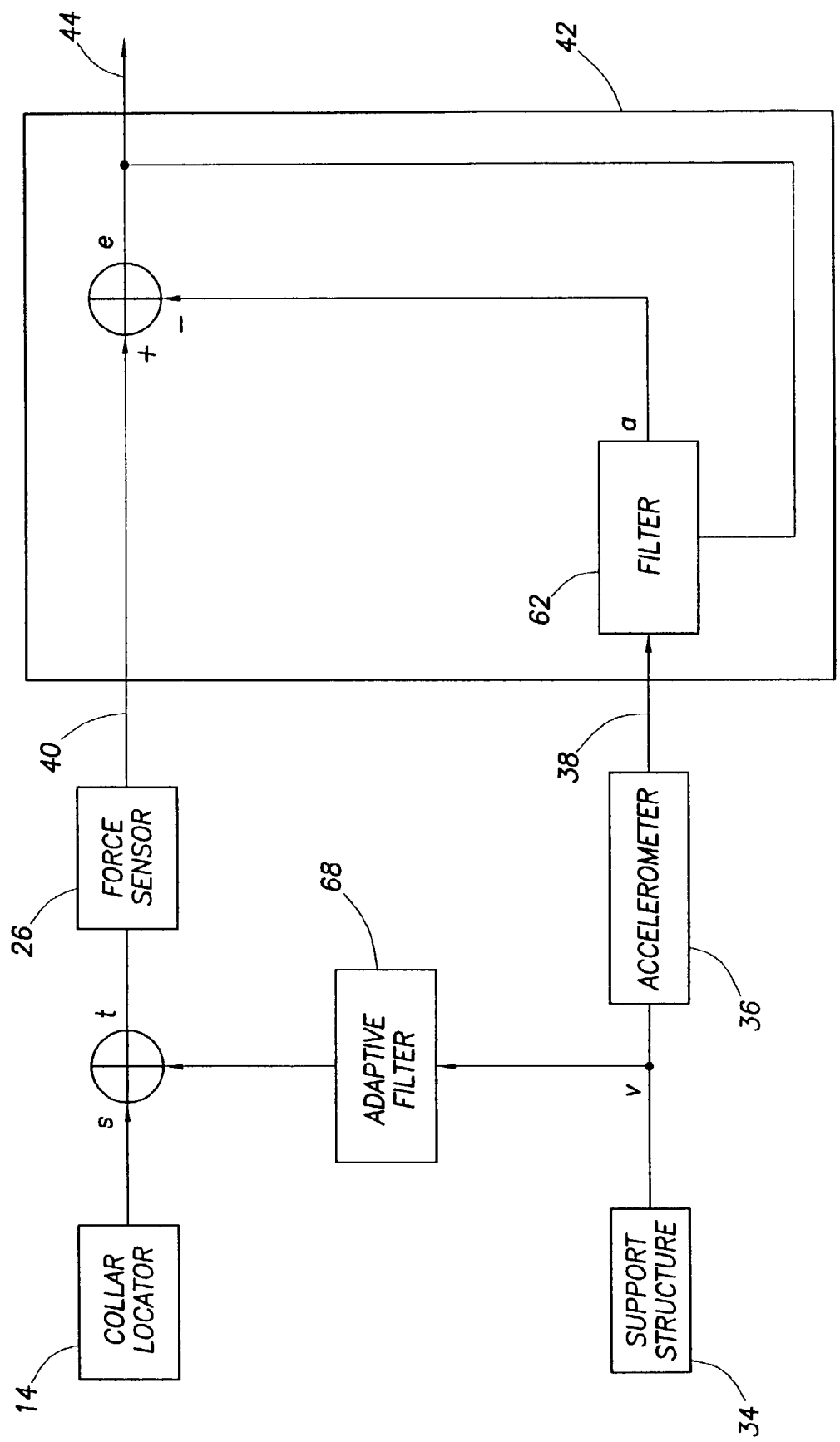
FIG. 4 is schematic diagram of a embodiment of the signal filtering device.

Referring additionally now to FIG. 4, a schematic diagram of the filtering device 42 is representatively illustrated. This schematic diagram is provided so that the reader will obtain a more complete understanding of how the filtering device 42 reduces or eliminates the noise signal in the contaminated sensor signal 40, without the benefit of a direct detection of the noise signal itself. For convenience, the optional converters 58, 66 are not illustrated in FIG. 4.

As depicted in FIG. 4, the letter "s" is used to indicate the desired tension signal in the slickline 20, which is due to operation of the tool 14 in the well, and which is contaminated by its combination with the noise signal. The support structure 34 is depicted in FIG. 4 as being the source of noise (indicated by the letter "v"). This noise v is altered in unknown ways by environmental factors 68, such as the specific structural characteristics of the slickline rig 12, etc., and results in a varying of the tension in the slickline 20 as indicated by the output 40 of the force sensor 26.

This varying of the slickline tension due to the noise source 34 is the noise signal, which is combined with the desired tension signal s to produce the noise-contaminated slickline tension (indicated by the letter "t"). The noise-contaminated slickline tension t is detected by the sensor 26, which produces a noise-contaminated signal 40.

The noise v is detected by the accelerometer 36, which produces the signal 38 indicative or characteristic of the noise v. Both the noise-contaminated signal 40 and the signal 38 characteristic of the noise v are input to the filtering device 42. The filtering device 42 includes the filter 62, which is preferably of the type known to those skilled in the art as an adaptive filter.

The filter 62 receives the signal 38 and produces an output signal indicated in FIG. 4 by the letter "a". The output signal a is summed with (actually, subtracted from) the noise-contaminated signal 40 to produce an "error" output indicated in FIG. 4 by the letter "e". This "error" output e is input to the adaptive filter 62, which adapts to minimize the "error".

Figure 5:
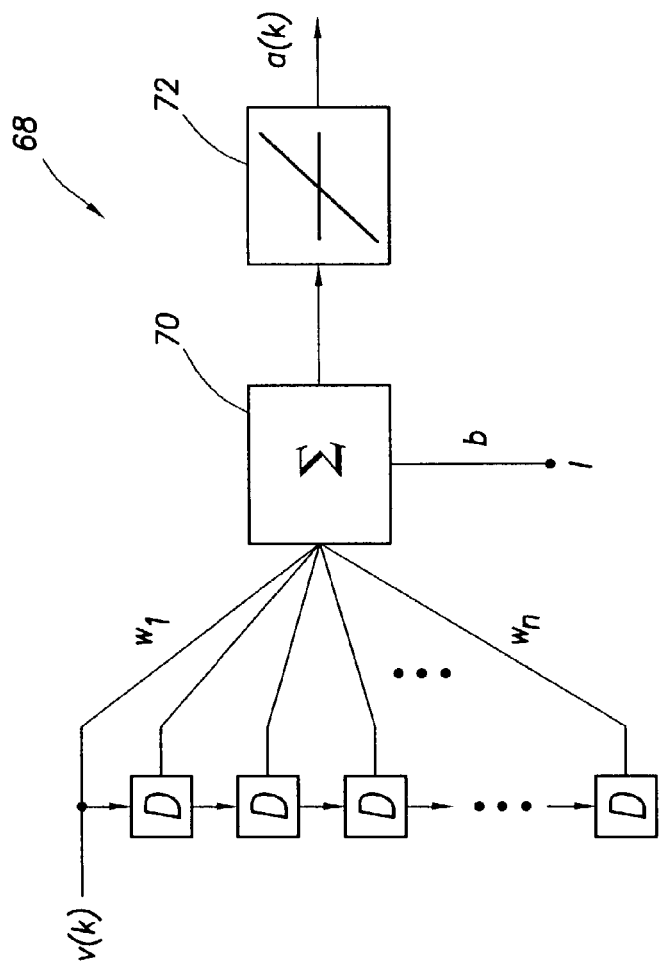
FIG. 5 is a schematic diagram of a first adaptive filter which may be used in the signal filtering device.

Referring additionally now to FIG. 5, an example of an adaptive filter 68 which may be used for the filter 62 in the filtering device 42 is representatively illustrated. The signal 38 characteristic of the noise v is indicated in FIG. 5 by the function v(k), where k is a time sample index. A number n of tapped-delay inputs D are individually weighted ($w_1$ through $w_n$) and summed in a summer 70 along with a parameter b. One or more additional optional linear function 72 may be applied to the output of the summer 70 to produce the output a(k).

Thus, the output a(k) of the filter 68 is given by the following equation:

$$a(k)=w_1v(k)+w_2v(k-1)+\ldots+w_nv(k-n)+b$$

The filter parameters w and b may be updated in real-time in the direction of gradient descent, i.e.:

$$w(k+1)=w(k)+\eta e(k)v^T(k)$$

$$b(k+1)=b(k)+\eta e(k),$$

where $w(k)=[w_1(k)\ w_2(k)\ \ldots\ w_n(k)]$, $v^T(k)=[v(k)\ v(k-1)\ \ldots\ v(k-n)]$, $\eta$ is the learning rate, and e(k) is the "error" at the sample time index k.

Each time an "error" value is obtained, a new sample is loaded, and the filter parameters are updated again. The learning rate $\eta$ and number n of tapped-delay lines D are preferably adjustable by the user, for example, using the user interface 54 depicted in FIG. 2 to obtain the "cleanest" (noise-free) output signal 44.

It is to be clearly understood that any type of adaptive filter could be used for the filter 62. For example, an adaptive IIR filter structure, or a more complex nonlinear filter, such as a neural network, could be used. Any of the many numerical optimization algorithms, such as the extended Kalman filter, recursive Gauss-Newton, recursive least-squares, Levenberg-Mardquart, etc. can be used to train or adjust the filter 62.

Figure 6:
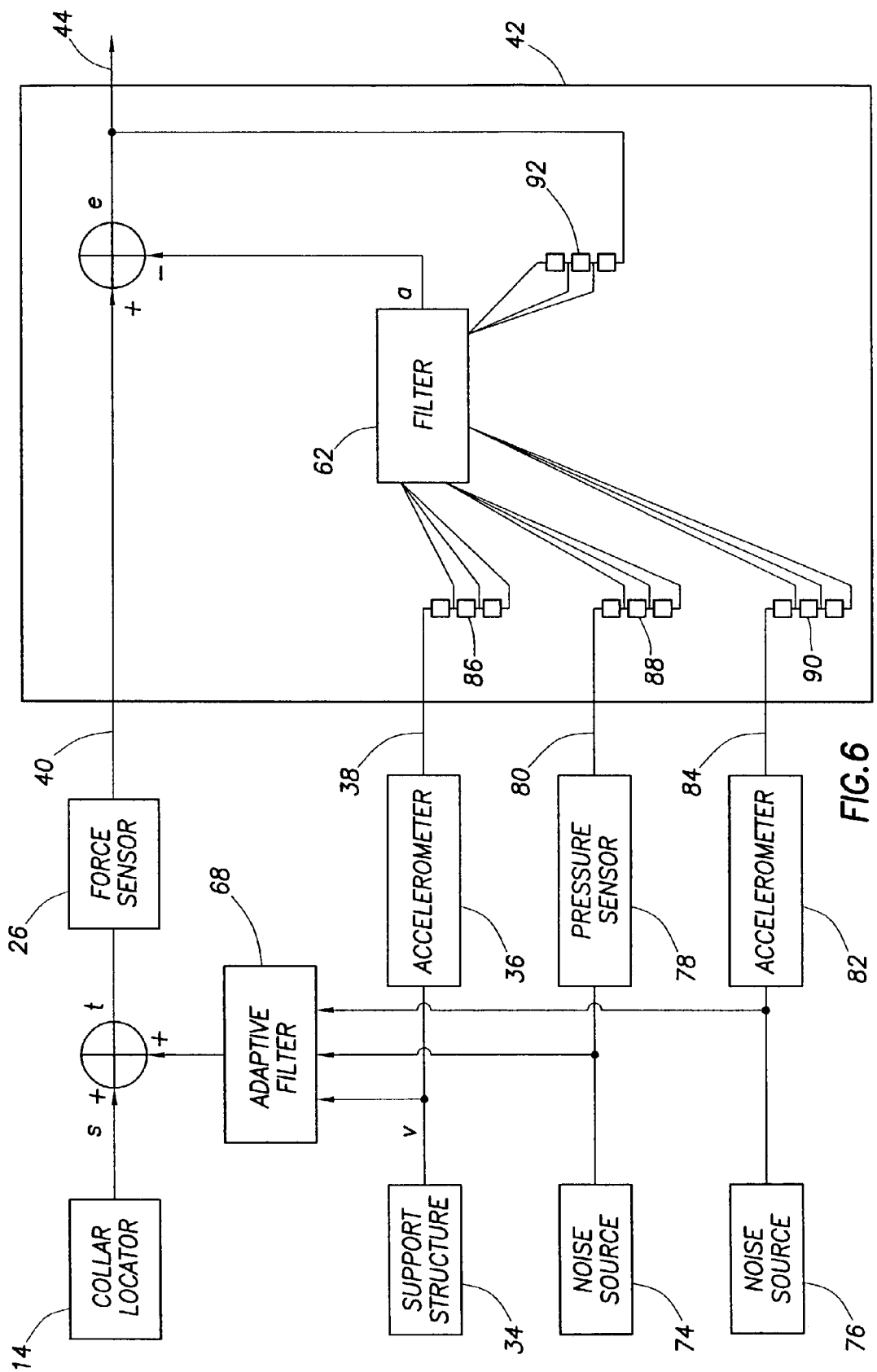
FIG. 6 is a schematic diagram of a second adaptive filter in an alternate construction of the signal filtering device.

Referring additionally now to FIG. 6, an alternate construction of the filtering device 42 is representatively illustrated. In this alternate construction, multiple noise sources 34, 74, 76 contribute to the slickline tension noise sensed by the force sensor 26. For example, the noise source 74 could be a hydraulic motor (not shown) used to rotate the reel 22. A pressure sensor 78 attached to the hydraulic motor may produce a signal 80 which is indicative or characteristic of pressure fluctuations in the hydraulic motor 74. The noise source 76 could be vibration in the arm 30 supporting the force sensor 26. This vibration may be sensed by an accelerometer 82 attached to the arm 30, the accelerometer thus producing a signal 84 indicative or characteristic of the vibration in the arm. Any number, type, combination, etc. of means for producing a signal indicative or characteristic of a noise source may be used in keeping with the principles of the invention.

Each of the signals 38, 80, 84 is input to the adaptive filter 62 using respective tapped-delay lines 86, 88, 90. The output a of the adaptive filter 62 is summed with the contaminated force sensor signal 40, and the resulting "error" e is also input to the filter using a tapped-delay line 92 to update the filter parameters w and b. Parameters of the filter 62, such as weights applied to each of the individual tapped-delay inputs, may be updated with each sample of values in the signals 40, 38, 80, 84.

One or more additional filters, such as the linear filter 72 shown in FIG. 5, may also be used in this alternate construction of the filtering device 42. Note that the filter 62 may be a linear adaptive filter, or a nonlinear adaptive filter, such as a neural network.

Figure 7:
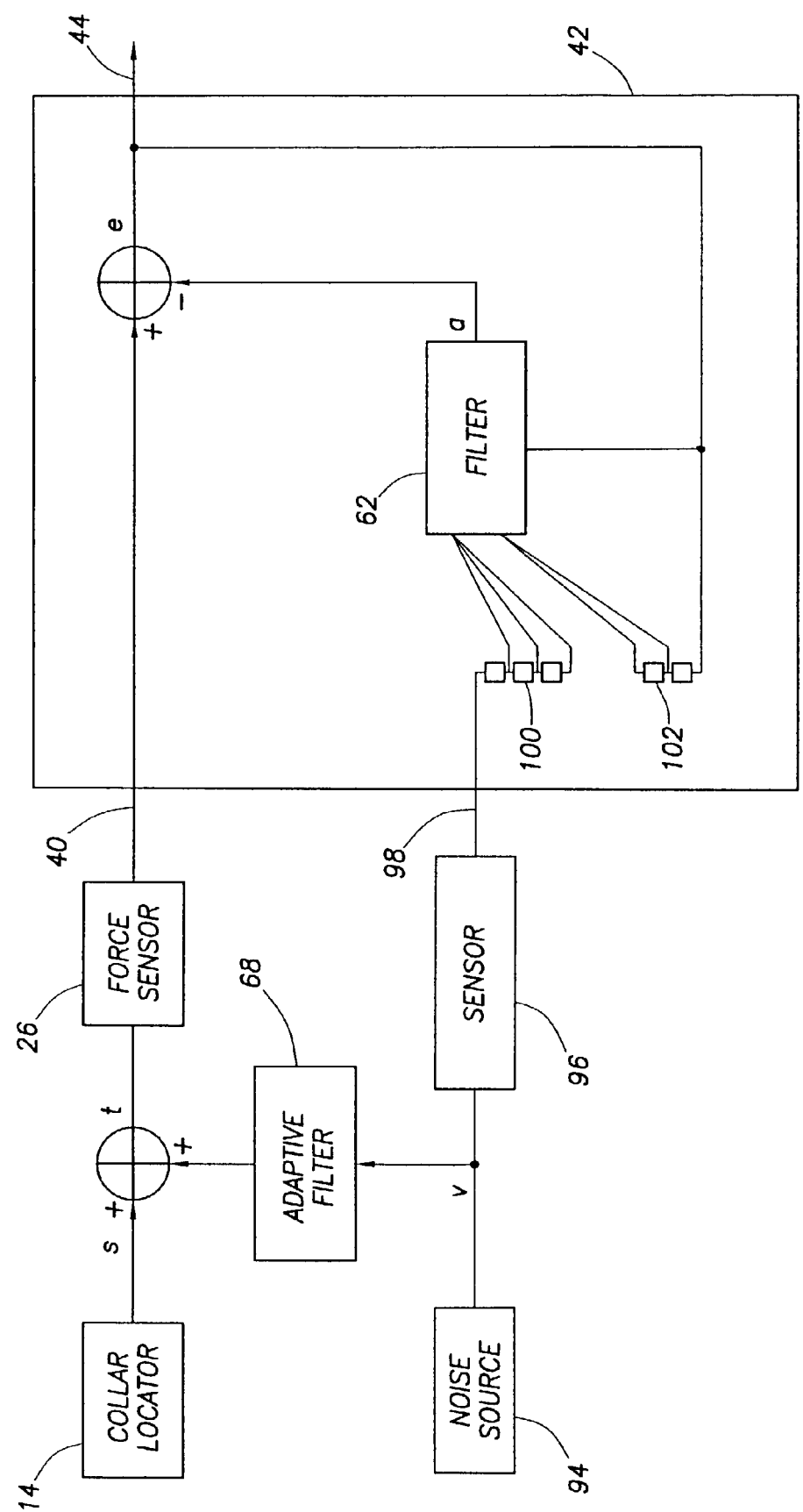
FIG. 7 is a schematic diagram of a third adaptive filter in another alternate construction of the signal filtering device.

Referring additionally now to FIG. 7, another alternate construction of the filtering device 42 is representatively illustrated. In this alternate construction, only one noise source 94 is used. A sensor 96 attached to, or part of, the noise source 94 produces a signal 98 indicative or characteristic of the noise generated by the noise source.

The signal 98 is input to the adaptive filter 62 via a tapped-delay line 100. The filter 62 generates an output a, which is summed with the noise-contaminated slickline tension signal 40. The resulting "error" e is input to the adaptive filter 62 via a tapped-delay line 102.

One or more additional filters, such as the linear filter 72 shown in FIG. 5, may also be used in this alternate construction of the filtering device 42. Note that the filter 62 may be a linear adaptive filter, or a nonlinear adaptive filter, such as a neural network.

Figure 8:
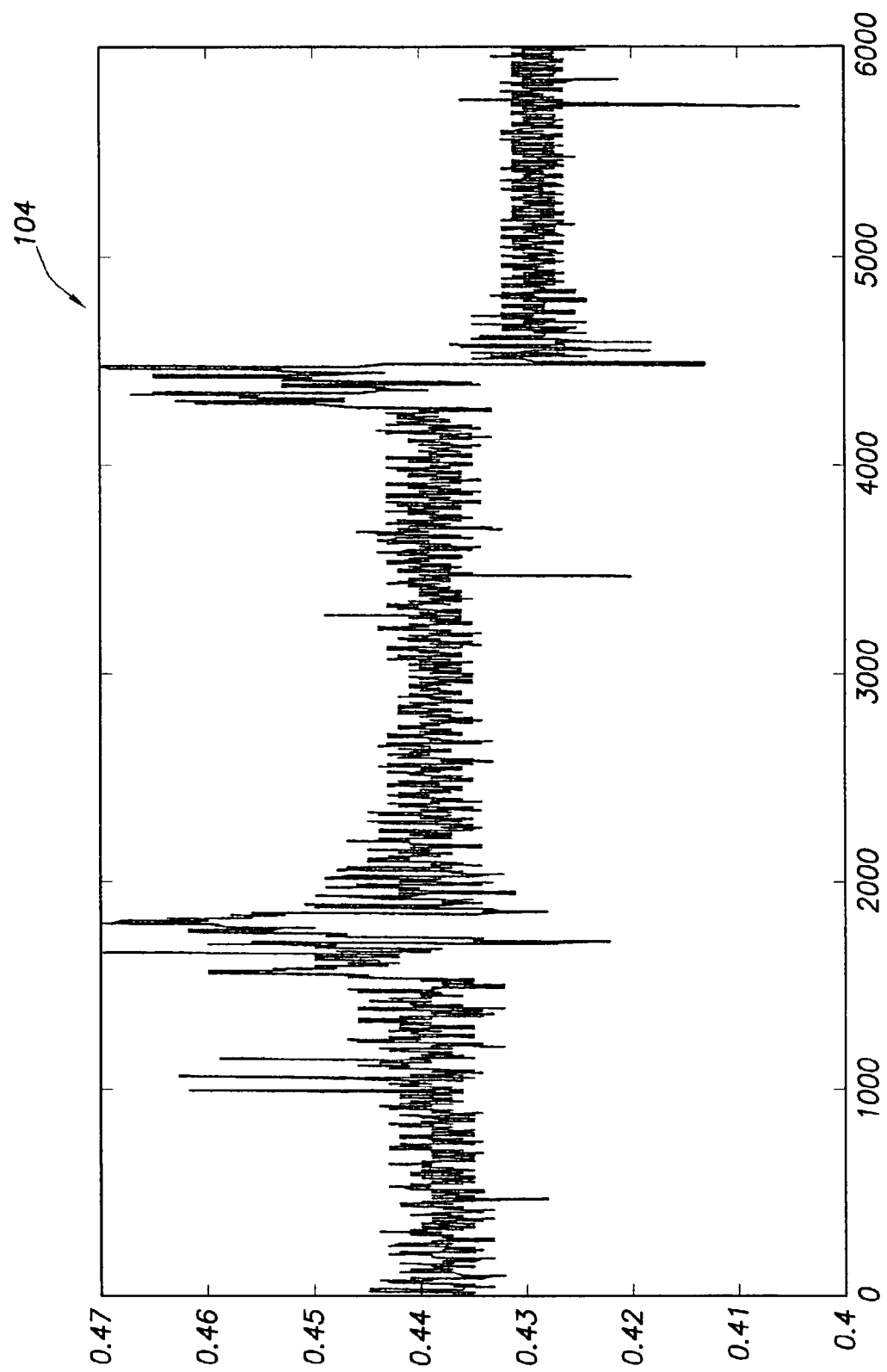
FIG. 8 is a graph of a noise-contaminated slickline tension signal.

Referring additionally now to FIG. 8, a graph of a noise-contaminated slickline tension signal 104 is representatively illustrated. The vertical axis is amplitude and the horizontal axis is sample time index. The FIG. 8 graph of the noise-contaminated slickline tension signal 104 is an actual output signal from a slickline load cell, such as the load cell or force sensor 26 of the slickline rig 12 depicted in FIG. 1. The signal 104 may be represented by the signal 40 in FIGS. 2–4, 6 and 7.

Note that the noise-contaminated signal 104 illustrated in FIG. 8 contains a desirable signal generated by tension in the slickline 20 due to operation of the tool 14, as well as an undesirable noise signal generated by tension in the slickline due to a noise source. The noise signal is unknown, and so it cannot simply be subtracted from the noise-contaminated signal 104 to produce the "clean" desirable signal.

Figure 9:
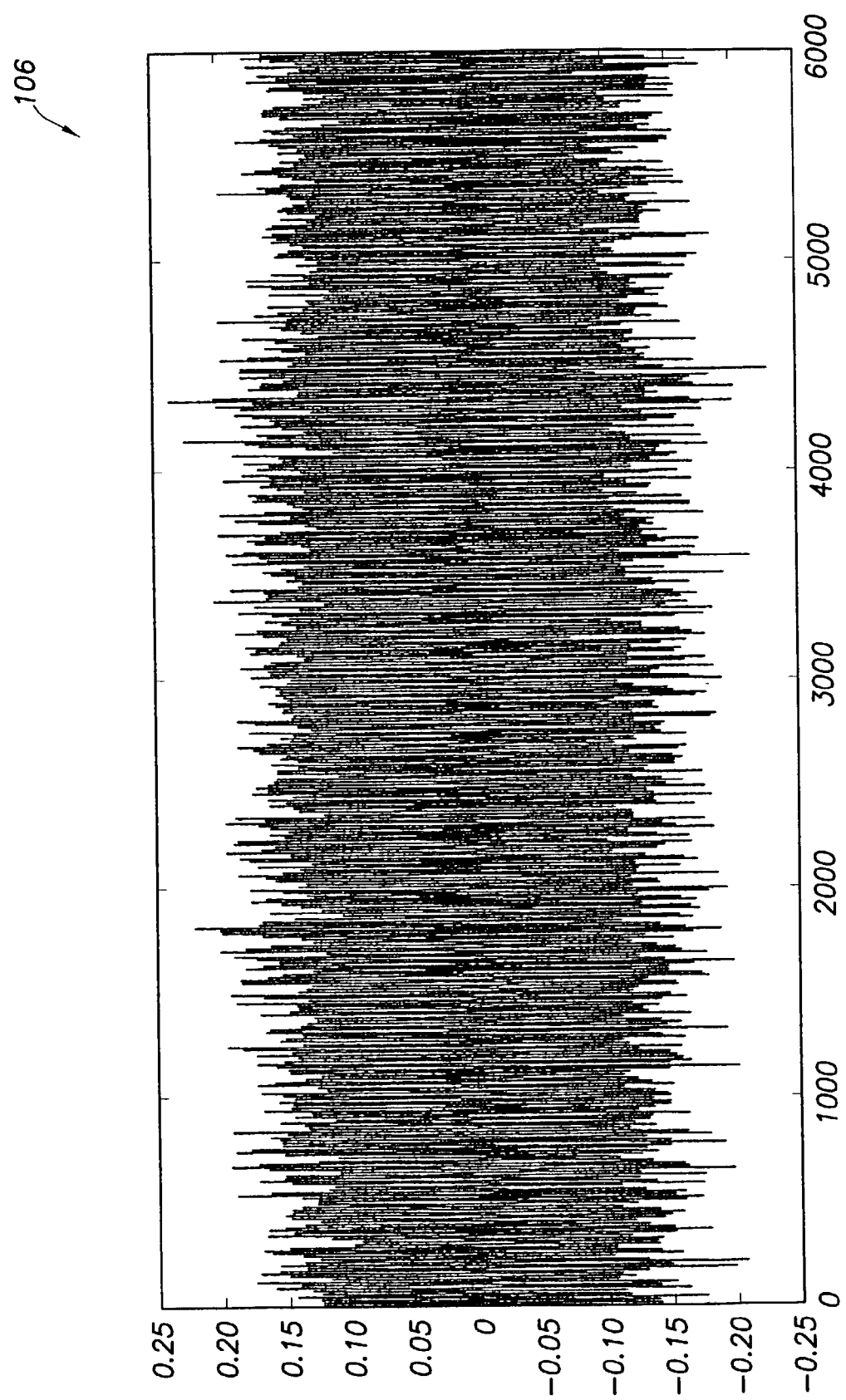
FIG. 9 is a graph of a signal characteristic of a noise source.

Referring additionally now to FIG. 9, a graph of a noise-indicative signal 106 is representatively illustrated. Again, the vertical axis is amplitude and the horizontal axis is sample time index.

The FIG. 9 graph of the noise-indicative signal 106 is an actual output signal from an accelerometer, such as the accelerometer 36 attached to the support structure 34 as depicted in FIG. 2. The signal 106 may be represented by the signal 38 in FIGS. 2–4 and 6, the noise-indicative signal function v(k) in FIG. 5, and the signal 98 in FIG. 7.

Note that the noise-indicative signal 106 is not the same as the noise signal added to the desirable slickline tension signal to produce the noise-contaminated signal 104 illustrated in FIG. 8. Instead, the noise-indicative signal 106 is merely representative of a characteristic of a noise source which contributes to the unknown noise signal.

Figure 10:
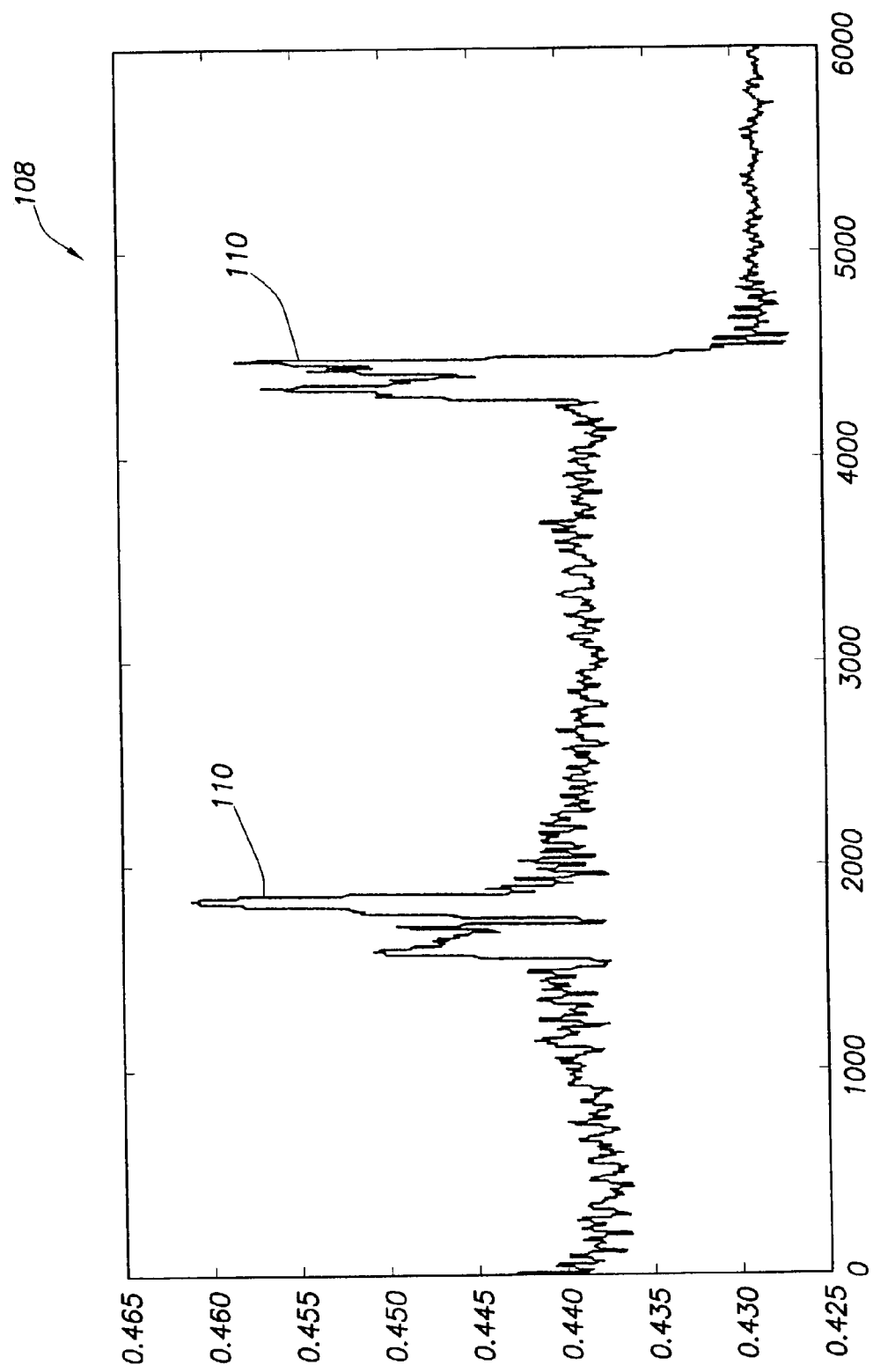
FIG. 10 is a graph of the slickline tension signal of FIG. 8, wherein the noise therein has been significantly reduced.

Referring additionally now to FIG. 10, a graph of an output signal 108 generated by a filtering device incorporating principles of the present invention is representatively illustrated. The signal 108 was obtained by inputting the signals 104, 106 to the filtering device (such as the filtering device 42 described above), which includes an adaptive filter (such as the filter 62 described above). The signal 108 may be represented by signal 44 in FIGS. 2–4, 6 and 7.

It will be readily appreciated that the present invention results in a significant reduction in the noise signal contribution to the signal 108. Compare the signal 108 to the noise-contaminated signal 104. Slickline tension signal increases 110 are far more distinguishable in the signal 108 as compared to the signal 104. Thus, the signal 108 permits more accurate detection of tension changes in the slickline 20 due to the collar locator 14 passing through casing collars 24, or due to the tool transmitting data bits via slickline tension modulation. The signal 108 may be input to the signal analysis unit 46 with greater confidence that an accurate analysis will be performed.

Figure 11:
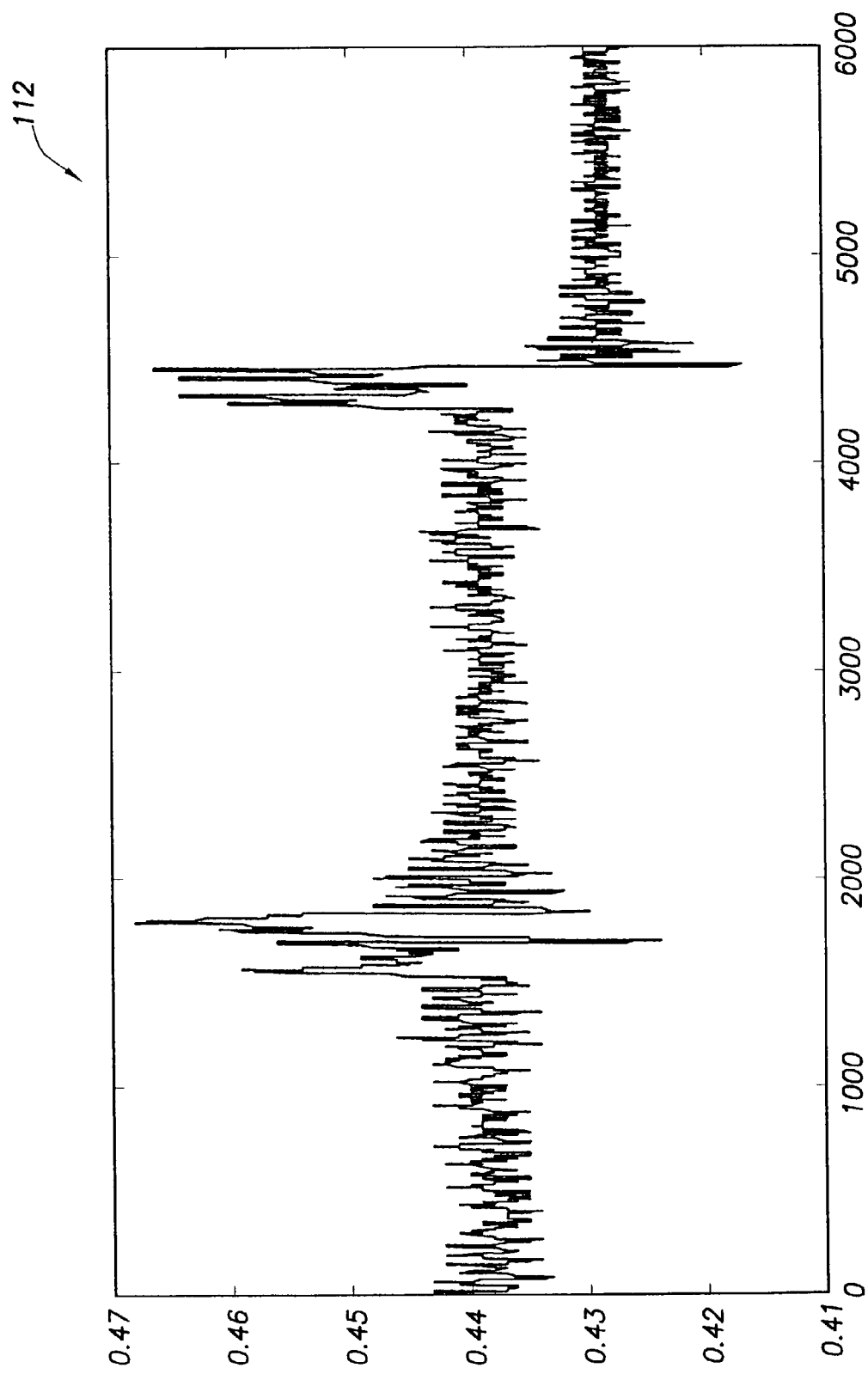
FIG. 11 is another graph of the slickline tension signal of FIG. 8, wherein the noise therein has been filtered using a conventional filter.

In FIG. 11 is illustrated the noise-contaminated signal 104 as filtered by a conventional filter. The resulting filtered signal 112 contains a greater contribution from the noise source as compared to the signal 108 illustrated in FIG. 10. The filter used in filtering the signal 112 is of the type known to those skilled in the art as a median filter. It will be readily appreciated that the signal 108 provides a far better basis for subsequent analysis than does the signal 112.

Of course, a person skilled in the art would, upon a careful consideration of the above description of representative embodiments of the invention, readily appreciate that many modifications, additions, substitutions, deletions, and other changes may be made to these specific embodiments, and such changes are contemplated by the principles of the present invention. Accordingly, the foregoing detailed description is to be clearly understood as being given by way of illustration and example only, the spirit and scope of the present invention being limited solely by the appended claims and their equivalents.

What is claimed is:

1. A method of reducing noise in a noise-contaminated signal, the method comprising the steps of:
    obtaining a noise-indicative signal which is indicative of a source of the noise;
    inputting the noise-indicative signal to an adaptive filter;
    summing an output signal of the adaptive filter with the noise-contaminated signal;
    inputting a sum resulting from the summing step to the adaptive filter; and
    adapting the adaptive filter in response to the noise-indicative signal inputting and sum inputting steps, the adapting step further comprising adapting the adaptive filter to thereby minimize the sum.

2. The method according to claim 1, further comprising the step of producing the output signal of the adaptive filter using a linear algorithm in the adaptive filter.

3. The method according to claim 1, further comprising the step of producing the output signal of the adaptive filter using a nonlinear algorithm in the adaptive filter.

4. The method according to claim 1, further comprising the step of providing the adaptive filter as a linear filter.

5. The method according to claim 1, further comprising the step of providing the adaptive filter as a nonlinear filter.

6. The method according to claim 1, wherein the obtaining step further comprises attaching a sensor to the noise source, an output of the sensor being the noise-indicative signal.

7. The method according to claim 6, wherein the attaching step further comprises attaching an accelerometer to the noise source.

8. The method according to claim 7, wherein the attaching step further comprises attaching the accelerometer to a structural component of a slickline rig.

9. The method according to claim 6, wherein the attaching step further comprises attaching a pressure sensor to the noise source.

10. The method according to claim 9, wherein the attaching step further comprises attaching the pressure sensor to a hydraulic component of a slickline rig.

11. The method according to claim 1, wherein the noise-indicative signal inputting step further comprises inputting the noise-indicative signal to the adaptive filter via a tapped-delay line.

12. The method according to claim 1, wherein the sum inputting step further comprises inputting the sum to the adaptive filter via a tapped-delay line.

13. The method according to claim 1, wherein the adapting step further comprises adjusting weights applied to individual tapped-delay inputs to the adaptive filter.

14. The method according to claim 1, wherein the adapting step further comprises adjusting a parameter summed with the noise-indicative signal in the adaptive filter.

15. A method of reducing noise in a noise-contaminated signal, the method comprising the steps of:
 obtaining a noise-indicative signal which is indicative of a source of the noise;
 inputting the noise-indicative signal to an adaptive filter;
 summing an output signal of the adaptive filter with the noise-contaminated signal;
 inputting a sum resulting from the summing step to the adaptive filter;
 adapting the adaptive filter in response to the noise-indicative signal inputting and sum inputting steps; and
 detecting tension in a slickline using a force sensor, the noise-contaminated signal being an output of the force sensor.

16. The method according to claim 15, wherein the detecting step further comprises detecting a desired tension in the slickline due to operation of a slickline tool in a well, and detecting undesired tension in the slickline due to the noise source.

17. A method of reducing noise in a noise-contaminated signal, the method comprising the steps of:
 obtaining a noise-indicative signal which is indicative of a source of the noise;
 inputting the noise-indicative signal to an adaptive filter;
 summing an output signal of the adaptive filter with the noise-contaminated signal;
 inputting a sum resulting from the summing step to the adaptive filter;
 adapting the adaptive filter in response to the noise-indicative signal inputting and sum inputting steps; and
 modulating tension in a slickline using a slickline tool positioned in a well, the tool-induced tension being representative of data bits, the slickline tool thereby transmitting information-carrying data bits to a slickline rig via slickline tension modulation, and the noise-contaminated signal including the transmitted data bits.

18. The method according to claim 17, wherein the modulating step further comprises varying a magnetic field generated by the slickline tool.

19. The method according to claim 18, wherein the varying step further comprises alternately turning on and off a magnet of the slickline tool.

20. The method according to claim 17, wherein in the transmitting step, the data bits are representative of an output of a sensor attached to the slickline tool.

21. A signal filtering apparatus, comprising:
 an adaptive filter which is a linear filter; and
 a summer,
 wherein the adaptive filter receives a signal indicative of a noise source, and produces a filtered output signal,
 wherein the summer receives a noise-contaminated signal and the filtered output signal, a sum produced by the summer being input to the adaptive filter, and
 wherein the adaptive filter adapts in response to the sum and the noise-indicative signal input to the filter.

22. A signal filtering apparatus, comprising:
 an adaptive filter which is a nonlinear filter; and
 a summer,
 wherein the adaptive filter receives a signal indicative of a noise source, and produces a filtered output signal,
 wherein the summer receives a noise-contaminated signal and the filtered output signal, a sum produced by the summer being input to the adaptive filter, and
 wherein the adaptive filter adapts in response to the sum and the noise-indicative signal input to the filter.

23. The apparatus according to claim 22, wherein the nonlinear filter is a neural network.

24. A signal filtering apparatus, comprising:
 an adaptive filter; and
 a summer,
 wherein the adaptive filter receives a signal indicative of a noise source, and produces a filtered output signal, the noise-indicative signal being produced by an accelerometer attached to the noise source, the accelerometer being attached to a structural component of a slickline rig,
 wherein the summer receives a noise-contaminated signal and the filtered output signal, a sum produced by the summer being input to the adaptive filter, and
 wherein the adaptive filter adapts in response to the sum and the noise-indicative signal input to the filter.

25. The apparatus according to claim 24, wherein the accelerometer detects vibration in the structural component.

26. The apparatus according to claim 25, wherein the vibration in the structural component induces tension in a slickline of the slickline rig.

27. The apparatus according to claim 26, wherein the noise-contaminated signal includes a noise signal indicative of the tension induced in the slickline by the structural component vibration.

28. A signal filtering apparatus, comprising:
 an adaptive filter; and
 a summer,
 wherein the adaptive filter receives a signal indicative of a noise source, and produces a filtered output signal, the noise-indicative signal being produced by a pressure sensor attached to the noise source,
 wherein the summer receives a noise-contaminated signal and the filtered output signal, a sum produced by the summer being input to the adaptive filter, and
 wherein the adaptive filter adapts in response to the sum and the noise-indicative signal input to the filter.

29. The apparatus according to claim 28, wherein the pressure sensor detects pressure fluctuations in a hydraulic component of a slickline rig.

30. The apparatus according to claim 29, wherein the pressure fluctuations in the hydraulic component induce tension in a slickline of the slickline rig.

31. The apparatus according to claim 30, wherein the noise-contaminated signal includes a noise signal indicative of the tension induced in the slickline by the pressure fluctuations in the hydraulic component.

32. A signal filtering apparatus, comprising:
 an adaptive filter; and
 a summer, wherein the adaptive filter receives a signal indicative of a noise source, and produces a filtered output signal, wherein the summer receives a noise-contaminated signal and the filtered output signal, a sum produced by the summer being input to the adaptive filter, wherein the adaptive filter adapts in response to the sum and the noise-indicative signal input to the filter, and further comprising a force sensor detecting tension in a slickline, the sensor producing the noise-contaminated signal.

33. A method of filtering a noise-contaminated slickline signal, the method comprising the steps of:

detecting tension in a slickline using a force sensor, an output signal of the force sensor being contaminated by noise due to a noise source inducing tension in the slickline;

generating a noise-indicative signal which is indicative of the noise source;

inputting the noise-indicative signal to an adaptive filter;

summing an output signal of the adaptive filter with the noise-contaminated force sensor output signal to thereby produce a sum;

inputting the sum to the adaptive filter; and adapting the filter in response to the noise-indicative signal inputting and sum inputting steps.

34. The method according to claim 33, wherein the generating step further comprises attaching a sensor to the noise source.

35. The method according to claim 34, wherein in the attaching step, the noise source is a component of a slickline rig to which the slickline is attached.

36. The method according to claim 35, wherein in the attaching step, the noise source is a structural component of the slickline rig, and the sensor is an accelerometer, the sensor being attached to the structural component to detect vibrations therein.

37. The method according to claim 35, wherein the attaching step further comprises attaching the sensor to a structural support for a reel of the slickline rig.

38. The method according to claim 35, wherein the attaching step further comprises attaching the sensor to a structural support for the force sensor.

39. The method according to claim 35, wherein in the attaching step, the noise source is a hydraulic component of the slickline rig, and the sensor is a pressure sensor, the pressure sensor sensing pressure fluctuations in the hydraulic component.

40. The method according to claim 33, wherein the adapting step further comprises minimizing the sum by adjusting at least one parameter of an algorithm in the adaptive filter.

* * * * *